US011688445B2

(12) United States Patent
Thirumala et al.

(10) Patent No.: US 11,688,445 B2
(45) Date of Patent: *Jun. 27, 2023

(54) VALLEY SPIN HALL EFFECT BASED NON-VOLATILE MEMORY

(71) Applicant: Purdue Research Foundation, West Lafayette, IN (US)

(72) Inventors: Sandeep Krishna Thirumala, West Lafayette, IN (US); Sumeet Kumar Gupta, West Lafayette, IN (US); Yi-Tse Hung, New Taipei (TW); Zhihong Chen, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/588,317

(22) Filed: Jan. 30, 2022

(65) Prior Publication Data

US 2022/0157359 A1 May 19, 2022

Related U.S. Application Data

(63) Continuation of application No. 16/909,971, filed on Jun. 23, 2020, now Pat. No. 11,250,896.

(60) Provisional application No. 62/865,280, filed on Jun. 23, 2019.

(51) Int. Cl.
| | | |
|---|---|---|
| *G11C 11/00* | (2006.01) | |
| *G11C 11/16* | (2006.01) | |
| *G11C 11/18* | (2006.01) | |
| *H10B 61/00* | (2023.01) | |
| *H10N 52/80* | (2023.01) | |
| *H10N 52/00* | (2023.01) | |

(52) U.S. Cl.
CPC ........ *G11C 11/161* (2013.01); *G11C 11/1673* (2013.01); *G11C 11/1675* (2013.01); *G11C 11/18* (2013.01); *H10B 61/00* (2023.02); *H10N 52/101* (2023.02); *H10N 52/80* (2023.02)

(58) Field of Classification Search
CPC .............. G11C 11/161; G11C 11/1673; G11C 11/1675; G11C 11/18; H01L 27/222; H01L 43/04; H01L 43/065
USPC ....................................................... 265/158
See application file for complete search history.

(56) References Cited

U.S. PATENT DOCUMENTS

| | | | | |
|---|---|---|---|---|
| 9,230,626 | B2 * | 1/2016 | Buhrman | ............ G11C 11/1697 |
| 9,805,795 | B2 * | 10/2017 | Rakshit | ................... G11C 11/18 |
| 9,881,660 | B2 * | 1/2018 | Yoda | ....................... H01L 43/08 |
| 10,008,248 | B2 * | 6/2018 | Buhrman | ............ G11C 11/1697 |
| 10,230,330 | B2 * | 3/2019 | Kudo | ................... H03B 15/006 |
| 10,333,058 | B2 * | 6/2019 | Aradhya | ................. H01F 10/30 |

(Continued)

*Primary Examiner* — Viet Q Nguyen
(74) *Attorney, Agent, or Firm* — Piroozi-IP, LLC

(57) ABSTRACT

A memory cell is disclosed which includes a semiconductor layer, a first electrode coupled to the semiconductor layer, a second electrode coupled to the semiconductor layer, wherein the first and second electrodes are separated from one another along a first axis and wherein the semiconductor layer extends beyond the first axis along a second axis substantially perpendicular to the first axis, thereby forming a first wing, a third electrode separated from the semiconductor layer by an insulating layer, a first magnetic tunnel junction (MTJ) disposed on the first wing, and a first read electrode coupled to the first MTJ.

19 Claims, 16 Drawing Sheets

(56) References Cited

U.S. PATENT DOCUMENTS

| | | | |
|---|---|---|---|
| 10,333,523 B2* | 6/2019 | Manipatruni | H03K 19/21 |
| 10,608,169 B2* | 3/2020 | Kim | G11C 11/161 |
| 10,734,052 B2* | 8/2020 | Al Azim | G11C 11/18 |
| 10,790,002 B2* | 9/2020 | Rakshit | G06N 3/063 |
| 10,886,460 B2* | 1/2021 | Kim | H01L 43/04 |
| 10,923,648 B2* | 2/2021 | Ahmed | G11C 11/5607 |
| 11,250,896 B2* | 2/2022 | Thirumala | G11C 11/1673 |
| 11,276,447 B2* | 3/2022 | Shiokawa | G11C 11/18 |
| 11,289,143 B2* | 3/2022 | Song | G11C 11/161 |

* cited by examiner

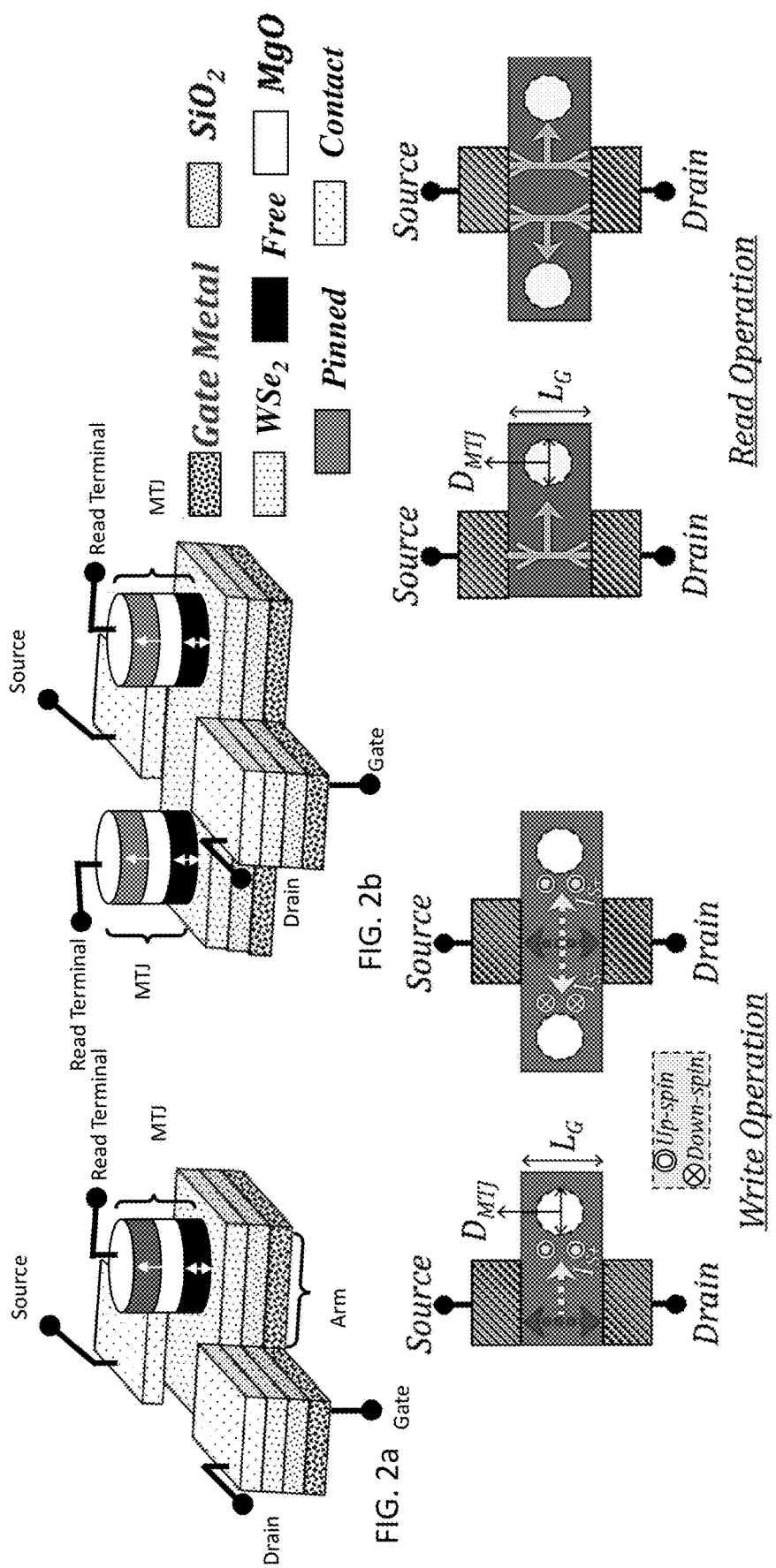

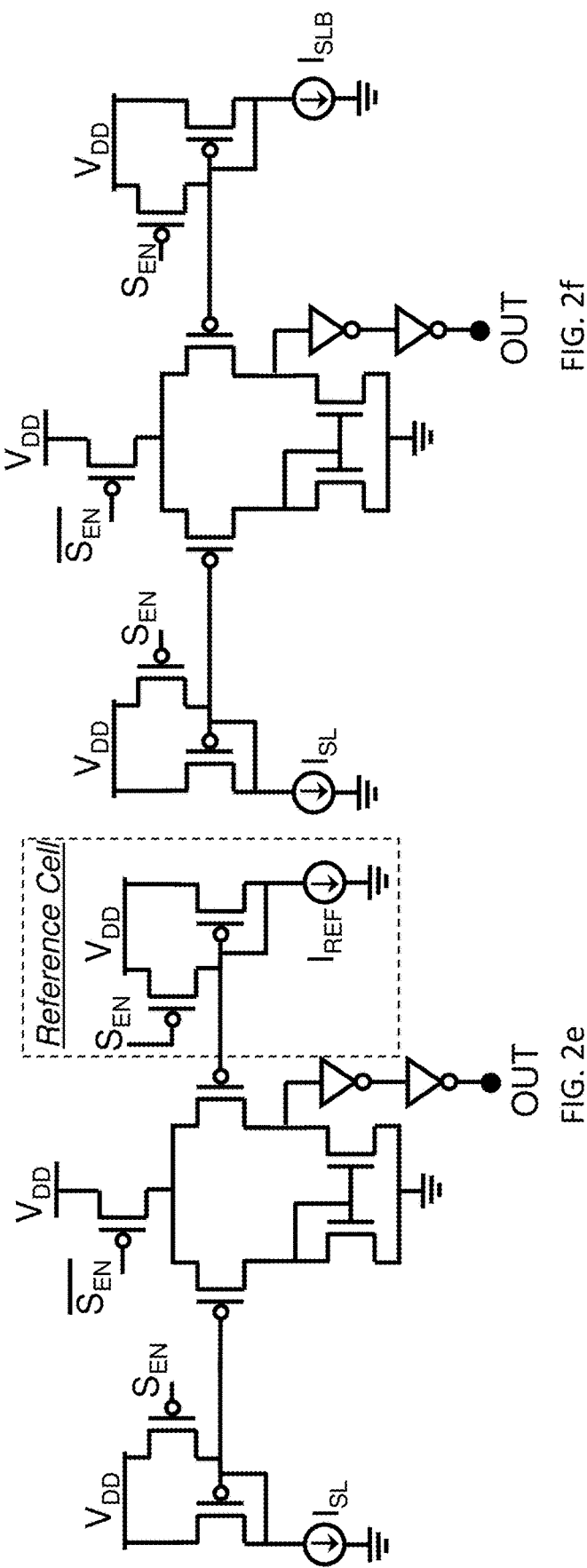

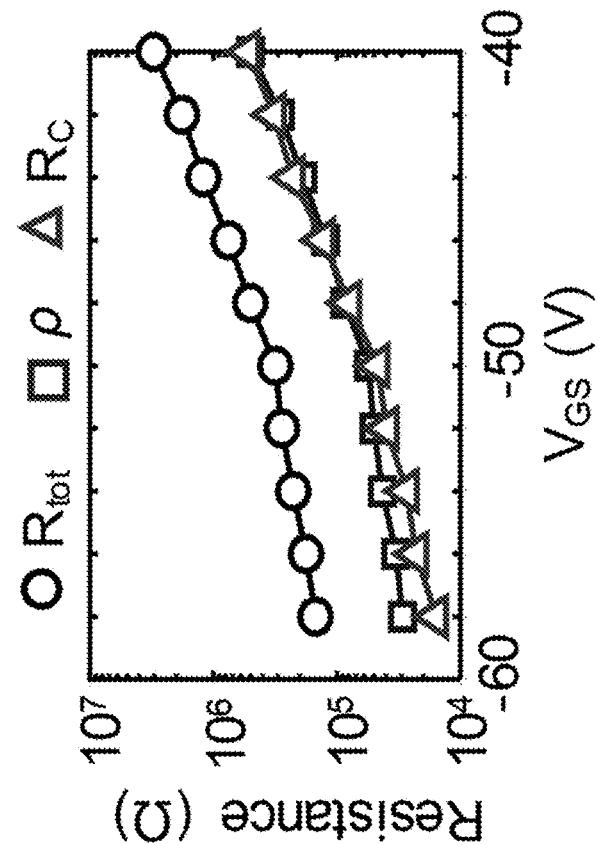
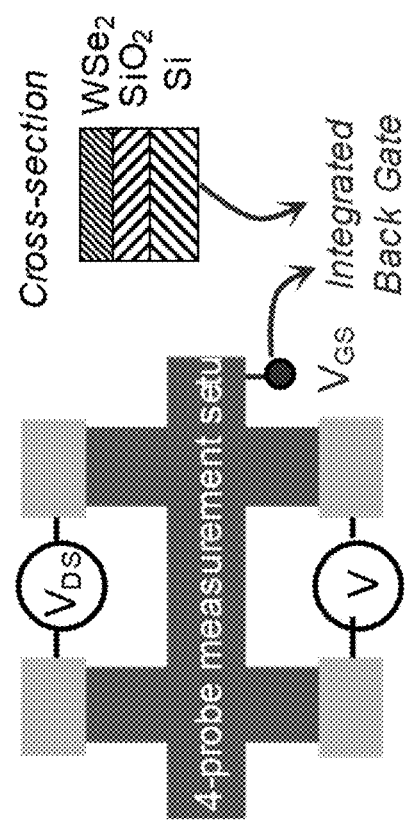
FIG. 4a
FIG. 4b

VALLEY SPIN HALL EFFECT BASED NON-VOLATILE MEMORY

CROSS-REFERENCE TO RELATED APPLICATIONS

The present patent application a continuation application of U.S. Non-Provisional application Ser. No. 16/909,971 filed Jun. 23, 2020, now U.S. Pat. No. 11,250,896 to Thirumala et al., which is related to and claims the priority benefit of U.S. Provisional Patent Application Ser. No. 62/865,280 filed Jun. 23, 2019, entitled "VALLEY SPIN HALL EFFECT BASED NON-VOLATILE MEMORY" the contents of each of which is hereby incorporated by reference in its entirety into the present disclosure.

STATEMENT REGARDING GOVERNMENT FUNDING

None.

TECHNICAL FIELD

The present disclosure generally relates to electronic memory, and in particular, to non-volatile memories that operate based on valley spin hall effect.

BACKGROUND

This section introduces aspects that may help facilitate a better understanding of the disclosure. Accordingly, these statements are to be read in this light and are not to be understood as admissions about what is or is not prior art.

Over the last decade, there has been an immense interest in emerging non-volatile memories (NVMs) due to their distinct advantages over the traditional silicon-based memories, such as near-zero stand-by leakage and high integration densities. However, they possess design conflicts and issues associated with reliability, robustness, and high write energy. Spin-based memories using magnetic tunnel junctions (MTJs) look promising with good endurance and high integration densities. Specifically, spin-transfer-torque magnetic read access memory (STT-MRAM) has attracted immense interest. SAMSUNG's STT-MRAM in 28 nm FDSOI platform and INTEL's FinFET based MRAM technology are some industrial efforts on the implementation of spintronic memory. However, there are several challenges which still need to be addressed. For example, these implementations exhibit low distinguishability between their bi-stable states making them prone to sensing failures. Also, due to their two-terminal cell-design, the write and read paths are coupled, leading to design challenges.

In addition, in the modern MTJ implementations utilizing giant spin hall (GSH) effect, the footprint for arrays of cells can be large since each cell typically includes an access transistor. The access transistor can constitute a large portion of the cell, thereby increasing the overall size of the cell.

Therefore, there is an unmet need for a novel nonvolatile memory cell with reduced footprint that is robust with respect to sensing failures.

SUMMARY

A memory cell is disclosed. The memory cell includes a conductive layer, an insulating layer disposed atop the conducting layer, a semiconductor layer disposed atop the insulating layer, a first electrode coupled to the semiconductor layer, and a second electrode coupled to the semiconductor layer, The first and second electrodes are separated from one another and wherein the semiconductor layer extends beyond the first and second electrodes forming a first wing. The memory cell further includes a third electrode coupled to the conductive layer. In addition, the memory cell includes a first magnetic tunnel junction (MTJ) disposed on the first wing. The first MTJ includes a first magnetic layer with a fixed a polarity (pinned layer (PL)) in a first direction, a second magnetic layer (free layer (FL)) having a polarity that can be switched from the first direction in which case the MTJ is in a parallel (P) configuration presenting an electrical resistance to current flow below a resistance threshold to a second direction opposite the first direction in which case the MTJ is in an anti-parallel (AP) configuration presenting an electrical resistance to current flow higher than the resistance threshold, and a non-magnetic layer (NML) separating the PL from the FL. the first MTJ presents an energy barrier (EB) to switching from P to AP or AP to P. The memory cell further includes a first read electrode coupled to the first MTJ.

An array made of memory cells is also disclosed. The array includes a plurality of memory cells dispersed in one or more rows and one or more columns. Each memory cell includes a conductive layer, an insulating layer disposed atop the conducting layer, a semiconductor layer disposed atop the insulating layer, a first electrode coupled to the semiconductor layer, and a second electrode coupled to the semiconductor layer. The first and second electrodes are separated from one another and wherein the semiconductor layer extends beyond the first and second electrodes forming a first wing. The memory cell also includes a third electrode coupled to the conductive layer. In addition, the memory cell includes a first magnetic tunnel junction (MTJ) disposed on the first wing. The first MTJ includes a first magnetic layer with a fixed a polarity (pinned layer (PL)) in a first direction, a second magnetic layer (free layer (FL)) having a polarity that can be switched from the first direction in which case the MTJ is in a parallel (P) configuration presenting an electrical resistance to current flow below a resistance threshold to a second direction opposite the first direction in which case the MTJ is in an anti-parallel (AP) configuration presenting an electrical resistance to current flow higher than the resistance threshold, and a non-magnetic layer (NML) separating the PL from the FL. The first MTJ presents an energy barrier (EB) to switching from P to AP or AP to P. THe memory cell also includes a first read electrode coupled to the first MTJ. Additionally the array includes a wordline (WL) for each row of the one or more rows coupled to the third electrodes of each of the associated memory cells in the associated row, a bit line (BL) for each column of the one or more columns coupled to the first electrodes of each of the associated memory cells in the associated column, a bit line bar (BLB) for each column of the one or more columns coupled to the second electrodes of each of the associated memory cells in the associated column, and a select line (SL) for each column of the one or more columns coupled to the first read electrodes of each of the associated memory cells in the associated column. By selectively activating the WL, BL, BLB, and SL, each of the memory cells is accessed for writing or reading i) one memory cell at a time, ii) a row of memory cells at a time, iii) column of memory cells at a time, or iv) the array at a time.

BRIEF DESCRIPTION OF DRAWINGS

FIGS. 2a and 2b are schematics of a single-ended memory device based on valley spin hall effect magnetic read access memory (VSH-MRAM), FIG. 2a, and a differential memory device DVSH-MRAM, FIG. 2b, according to the teachings of the present disclosure, each without an access transistor.

FIGS. 2c and 2d are cross-sectional representations of the VSH-MRAM and DVSH-MRAM according to the present disclosure.

FIGS. 2e and 2f are circuit diagrams for two sense amplifier configuration, single-ended in FIG. 2e and differential in FIG. 2f.

FIG. 4a is a schematic of a four-probe measurement scheme used to make measurements for the devices of the present disclosure.

FIG. 4b is a graph of resistance vs. $V_{GS}$ showing the three aforementioned types of resistance, i.e., $\rho$, $R_C$, and $R_{TOT}$ vs. $V_{GS}$.

DETAILED DESCRIPTION

Figure 1A:
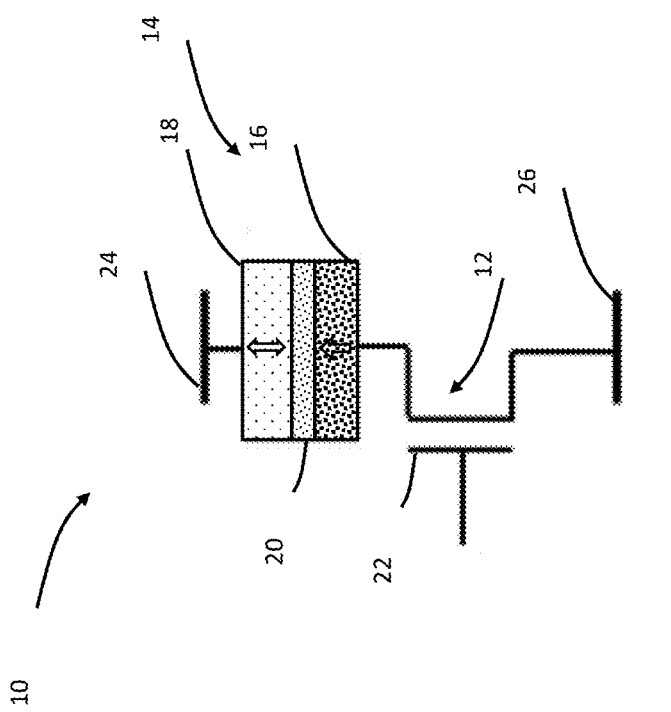
FIG. 1a is a schematic of a typical magnetic tunnel junction cell.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

A novel nonvolatile memory cell with reduced footprint that is robust with respect to sensing failures is disclosed. This novel nonvolatile memory cell operates on the basis of valley spin hall (VSH) effect. The novel cell does not require an access transistor allowing a reduced size for the cell. In addition, the cell is designed to be robust with respect to sensing failures by implementing a differential scheme.

Prior to discussing the specifics of the novel memory cell according to the present disclosure, a discussion of technologies used in the memory cell of the present disclosure are provided including a discussion on a typical magnetic tunnel junction (MTJ) cell and giant spin hall (GSH) effect.

Magnetic Tunnel Junction (MTJ)

A typical MTJ cell is shown in FIG. 1a. A typical spin-transfer-torque magnetic read access memory (STT-MRAM) bit cell 10 is shown. The STT-MRAM bit cell 10 includes an access transistor 12 and a magnetic tunnel junction (MTJ) stack 14. The MTJ Stack 14 is positioned between a high side node 24 and the access transistor 12 and includes a ferromagnetic pinned layer 16 (which has a fixed magnetic orientation) and a free layer 18 (whose orientation can be switched), separated by a tunneling oxide barrier 20. The access transistor is positioned between the MTJ stack 14 and a low side node 26 and is controlled by a gate 22. The logic state stored in the bit cell depends on the relative orientation between the free layer 18 and the pinned layer 16. Accordingly, for example parallel orientation (i.e., both layers having the same orientation) represents "0" and antiparallel orientation represents "1". Two operations are of importance: a read operation and a write operation. A read operation involves activating the gate 22 of the access transistor 12 and applying a bias voltage (Vread) between the high side node 24 and the low side node 26. A write operation is performed by passing a current greater than a critical switching current (Ic) of the MTJ stack 14 (critical current is the current that can cause the free layer to switch from one orientation to another) for a minimum switching duration. The current direction to write a "1" vs. a "0" differs based on the logic value to be written into the STT-MRAM bit cell 10. A read operation requires a small current (i.e., much smaller than the critical switching current) to be passed through the STT-MRAM bit cell 10. This read operation can be accomplished based on a voltage-based sensing scheme wherein a small known current is applied to the high side node 24 and resistance across the STT-MRAM bit cell 10 is measured. A higher resistance (e.g., between about 30 kohms and about 45 kohms) represents a "1"—representing antiparallel orientation—while a lower resistance (e.g., between about 10 kohms and about 15 kohms) represents a "0"—representing parallel orientation—where resistance is measured by comparing the voltage across the STT-MRAM bit cell 10 against a reference voltage Vref (a voltage lower than the voltage associated with the high resistance and higher than the voltage associated with the low resistance); or based on a current-based sensing wherein a small voltage is applied across the STT-MRAM cell 10 and the current through the STT-MRAM cell 10 is measured, where a large current represents a "0", representing a parallel orientation, and small current represents a "1".

Giant Spin Hall (GSH) Effect

The Giant Spin Hall effect is an efficient mechanism for generating spin polarized currents. A charge current passing through a heavy metal layer such as Ta, Pt or W have been experimentally demonstrated to generate in-plane spin polarized currents.

Recent advancements with the possibility of generating spin polarized current using charge current in heavy metals has led to the realization of the Giant Spin Hall (GSH) effect based MRAM (also known as spin-orbit-torque MRAM; SOT-MRAM). Compared to STT-MRAMs, GSH-MRAM showcase significant improvement in write energy along with the possibility to independently co-optimize the read and write operations due to their decoupled read and write current paths. GSH effect also enables the possibility of achieving a differential storage due to the simultaneous generation of opposite polarized spin currents. However, both the single ended and differential memory designs based on GSH effect require multiple access transistors leading to a significant area penalty. Also, the spin injection efficiency which is directly proportional to the spin hall angle ($\theta_{SH}$<0.3) is low for these heavy metals. This results in performance degradation and energy inefficiency. Another drawback with GSH-MRAMs is that they can only switch IMA magnets without the presence of any external magnetic field or geometrical changes to the ferromagnet. As PMA magnets are known to be more energy efficient in switching and thermally stable than IMA, GSH-MRAMs offer limited performance and energy benefits. Therefore, there arises a need to explore new memory technologies to harness the full potential of spin-based storage.

Figure 1D:
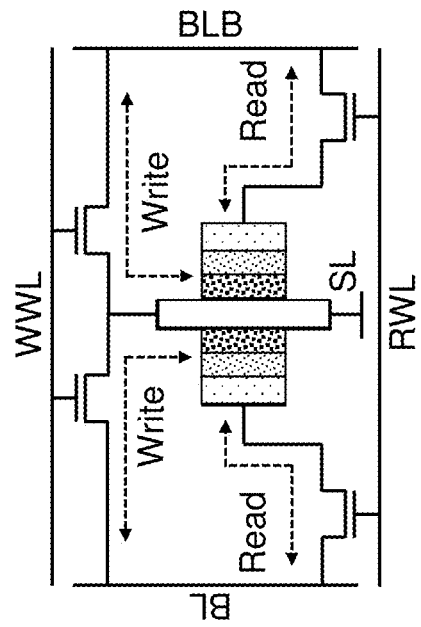
FIGS. 1c and 1d are a circuit schematics of GSH-MRAM which includes a read and write access transistor for single-ended memory (FIG. 1c), and a differential DGSH-MRAM (FIG. 1d) which shows a differential DGSH-MRAM bit-cell schematic which includes a read and write access transistor for each side of the differential DGSH-MRAM cell.
Figure 1C:
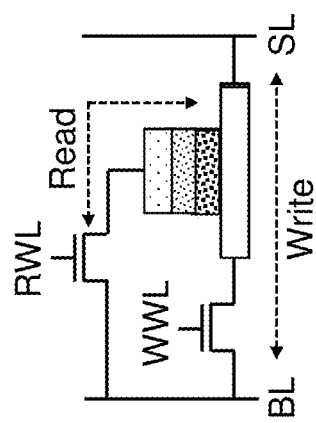
Figure 1B:
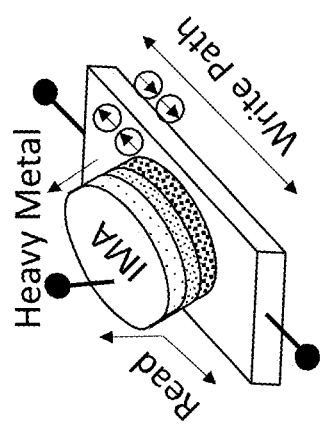
FIG. 1b is a schematic of a giant spin hall (GSH) effect in heavy metal leading to magnetization switching in an MTJ.

Referring to FIG. 1b, a schematic of GSH effect in heavy metal leading to magnetization switching in an MTJ is shown, which provides a three-terminal device structure of the GSH effect-based spin device. The GSH effect is mainly used for switching magnetization of in-plane magnetic anisotropy (IMA) magnets. Deterministic switching of perpendicular magnetic anisotropy (PMA) magnets using GSH effect requires externally assisted magnetic field to break the symmetry or complex design modifications to the MTJ geometry. The major advantage with GSH effect-based magnetization switching is the low write current/energy when compared to the STT-based magnetization switching.

The generated spin current ($I_S$) to charge current ($I_C$) ratio which is also known as the spin injection efficiency is directly proportional to the spin hall angle, $\theta_{SH}$. Experiments have shown $\theta_{SH}$ ~0.1-0.3 for heavy metals, resulting in low spin injection efficiency. Furthermore, the efficiency of GSH effect is impacted by the spin-flip length ($\lambda_S$), which characterizes the mean distance between spin-flipping collisions. As has been calculated to be about 1-2 nm for heavy metals with large GSH effect.

The three terminal device structure of the GSH effect-based spin device shown in FIG. 1b, mitigates the read-write conflict of the two terminal STT-MRAM due to the separation of read-write paths. Moreover, such an approach has shown to be promising for energy-efficient storage compared to STT-MRAM. Several bit-cell designs have been proposed using the GSH effect, including a single ended GSH-MRAM, FIG. 1c, which shows a circuit schematic of GSH-MRAM which includes a read and write access transistor for single-ended memory, and a differential DGSH-MRAM, FIG. 1d, which shows a differential DGSH-MRAM bit-cell schematic which includes a read and write access transistor for each side of the differential DGSH-MRAM cell. Write operation is achieved by turning ON the write access transistor and depending on the direction of charge current flow (which determines the spin current polarization), the MTJ state is stored. The spin current interacting with the MTJ to deterministically switch the magnetization is calculated as:

$$I_S = \frac{A_{MTJ}}{A_{HM}} * \theta_{SH} * I_C \tag{1}$$

where $A_{MTJ}$ and $A_{HM}$ are the cross-sectional area of MTJ and heavy metal, respectively. The read operation is carried out by turning ON the read access transistor and sensing the resistance state of the MTJ (parallel (P) or anti-parallel (AP)). As the read and write paths are decoupled, they can be optimized independently.

Utilizing the opposite spin generation at the top and bottom surfaces of the heavy metal, a differential GSH-MRAM (DGSH-MRAM) was proposed in with two MTJs placed on either side of the heavy metal layer (see FIG. 1d), representing a complimentary bit storage in the memory cell. The write operation remains the same as GSH-MRAM while the read is achieved using differential sensing, leading to higher sense margins. However, compared to GSH-MRAM, two more additional transistors are required to selectively access a bit cell in an array without disturbing the unassessed cells. Furthermore, fabrication of differential MTJs on the top and bottom sides of the heavy metal increases processing complexities and costs.

The above mentioned GSH effect-based memory designs have been proposed to switch IMA based MTJs, since only in-plane spin polarized currents are generated in the heavy metals. IMA magnets are not suitable for ultra-scaled dimensions due the limit on the aspect ratio of the free layer as well as low thermal stability. In comparison, PMA magnets are more stable and robust at scaled dimensions with high packing density, which is mainly attributed to the absence of in-plane shape magnetic anisotropy. Moreover, due to the absence of de-magnetization fields, lower energy is required for magnetization switching in PMA magnets compared to IMA, even at iso-thermal stability. Although, GSH effect-based PMA switching has been demonstrated with external magnetic field, or GSH assisted STT switching or a local di-polar field or introducing tilted anisotropy in the ferromagnet, the feasibility of achieving such a design change in scaled, high density technologies is yet to be explored. Moreover, the requirement of additional access transistors for GSH effect-based bit-cell designs leads to large area overheads which also increases the energy consumption for bit-line and word-line charging.

These issues are addressed by utilizing the valley-coupled-Spin Hall (VSH) effect in monolayer $WSe_2$ to design MRAMs based on PMA magnets. The VSH effect is suited to switch PMA magnets, which promises higher energy efficiency in the memory cells of the present disclosure eliminating the need for access transistors altogether.

Towards this end, the present disclosure presents novel memory cells provided in FIGS. 2a and 2b. With reference back to FIGS. 2a and 2b, a single-ended memory device and a differential memory device are shown, respectively. Single-ended VSH-MRAM includes one arm (also referred to herein as a first wing) along which the transverse spin current flows. On the other hand, the differential DVSH-MRAM contains two arms (also referred to herein as a first wing and a second wing) for complementary spin current flow. In the single ended design, a PMA MTJ is integrated on top of the arm of the monolayer TMD spin generator as shown in the FIG. 2a whose free layer (FL) is used for non-volatile magnetic storage. In the differential design, as shown in FIG. 2b, two PMA MTJs storing true and complementary values are integrated on the two arms of the spin generator. The read terminals of the memory devices (connected to the pinned layer of the read MTJs (see FIGS. 2a and 2b) are used to sense the bit-information stored. By virtue of VSH-based write and MTJ-based read, the memory devices according to the present disclosure advantageously feature decoupled read-write paths.

The VSH effect in monolayer $WSe_2$ generates out-of-plane spin current ($I_S$), which interacts with the MTJ through spin torque to switch the Free Layer magnetization. Since VSH effect leads to the flow of opposite spin currents in divergent directions, the DVSH-MRAM according to the present disclosure is able to seamlessly store and switch both true and complementary bits. The direction of the charge current ($I_C$) (controlled by the polarity of drain-to-source voltage ($V_{DS}$)) determines the polarization of the spin current ($I_{S+}/I_{S-}$) flowing towards the MTJ(s). Referring to FIGS. 2c and 2d which are cross-sectional representations of the VSH-MRAM and DVSH-MRAM according to the present disclosure, the out-of-plane spin currents are shown. When the current flows from the drain to source terminals, $I_{S+}$ flows towards the MTJ in VSH-MRAM and $I_{S+}/I_{S-}$ flow towards the right/left MTJ ($MTJ_{R/L}$) in DVSH-MRAM. These spin currents generate spin torque leading to parallel (P) state in the MTJ of VSH-MRAM, and P and anti-parallel (AP) states in $MTJ_R$ and $MTJ_L$ respectively, in DVSH-MRAM. Current is passed in the opposite direction to give the opposite states. This corresponds to the write operation of the memory devices of the present disclosure. For reading the bit-information, the resistance difference between the P and AP states of MTJs are measured. The read current flows from the source and drain terminals of the transistor to the read terminal of MTJs, in a 'T'/'H' shape as illustrated in FIGS. 2c and 2d, for VSH/DVSH-MRAMs. Based on the current sensed at the read terminals (which depend on the state of MTJ, P/AP), the bit-information stored is retrieved. It is important to note that VSH-MRAM achieves single-ended sensing using a reference current source, while DVSH-MRAM enables differential sensing leading to higher sense margins and self-referenced operation.

In order to read the MTJs, a current based reconfigurable sense amplifier which can dynamically switch its operation between differential sensing mode (for memory-read) and single ended sensing mode is provided in FIGS. 2e and 2f which are circuit diagrams for these two sense amplifier configuration (i.e., single-ended in FIG. 2e and differential in FIG. 2f). The basic configuration is shown in FIG. 2e which is for VSH-MRAM (i.e., the single-ended version), a current-mirror based sense amplifier along with a reference current generation circuit is used, as is known to a person having ordinary skill in the art. During the standard memory-read mode, single ended sense amplifier (see FIG. 2e) to read the bits stored in VSH-MRAMs. A reference cell is used to generate a reference current which is the average of current for the parallel mode and current for the anti-parallel mode (i.e., $I_P+I_{AP}/2$), which is then compared with the current sensed ($I_{SL}$) at the sense line. If $I_{SL}=I_P$, then the sense amp output is '1', else if $I_{SL}=I_{AP}$, then sense amp output is '0'. Similarly, for DVSH-MRAM, a differential sense amplifier is used (see FIG. 2f) to read the bit-information. Here, the sensed currents are $I_{SL}$ and $I_{SLB}$ which compared with each other to determine the bit-stored. If $I_{SL}=I_P$ and $I_{SLB}=I_{AP}$, then the sense amp output is '1', else it is '0'.

One unique aspect of the memory devices of the present disclosure is the integrated back gate, which enables modulation of the $I_C$, $I_S$ and hence the switching characteristics of the PMA magnets (gate controllability quantified later). In the present disclosure, this aspect is utilized for compact memory design, i.e., an –MTJ based memory without access transistor.

In order to better explain the memory cell of the present disclosure, first, the VSH effect is further described.

Valley-Coupled-Spin Hall (VSH) Effect

Monolayer transition metal dichalcogenides (TMDs) are multi-valley 2D semiconductors (FIG. 3a, which shows a schematic of a band structure of $WSe_2$ showcasing spin-valley coupling resulting in VSH effect) with inherent broken inversion and preserved time reversal symmetries. Time reversal symmetry requires that the spin polarization in the K valley and K' valley must be opposite (illustrated as solid and hollow arrows in FIG. 3a), which in combination with the large spin splitting ($\Delta_{SP}$) in the valence band for TMDs such as $WSe_2$, gives rise to holes in the K and K' valley with opposite signs of spin polarization at the Fermi level. As a result, carriers in the K valley and K' valley of the valence band (p-type) possess nonzero Berry curvature ($\Omega$) such that $\Omega(K)=-\Omega(K')$. The resultant transverse carrier velocity leads to valley-coupled spin currents on the application of electric field. This phenomenon is called the VSH effect. VSH effect in $WSe_2$ generates out-of-plane spin polarized currents ($I_{S+}$ and $I_{S-}$ shown in long-dashed and dotted arrows, respectively; see FIG. 3a) which can switch PMA magnets without any external magnetic field (BExT) or complex changes to the MTJ structure, unlike GSH-effect based memory devices.

It has been demonstrated that monolayer TMDs exhibit a large valley-hall angle, $\theta_{VH}$~1 at 25° C. Due to the existence of strong spin-valley coupling in monolayer $WSe_2$ (as a result of large $\Delta_{SP}$), the $\theta_{SH}$ is expected to be equal to $\theta_{VH}$, i.e., $\theta_{SH}$~1. The large $\theta_{SH}$ corresponds to high spin injection efficiency which can potentially lead to enhanced energy efficiency during magnetization switching. In contrast, GSH effect exhibit relatively much smaller $\theta_{SH}$~0.1-0.3. Moreover, VSH effect resulting in out-of-plane spin generation exhibits $\lambda_S$ of 0.5-1 μm (unlike GSH effect in heavy metals; $\lambda_S$~1-2 nm). The large $\theta_{SH}$ and $\lambda_S$ in monolayer $WSe_2$ advantageously and surprisingly provide novel opportunities for memory applications.

Figures 3A, 3B, 3C:
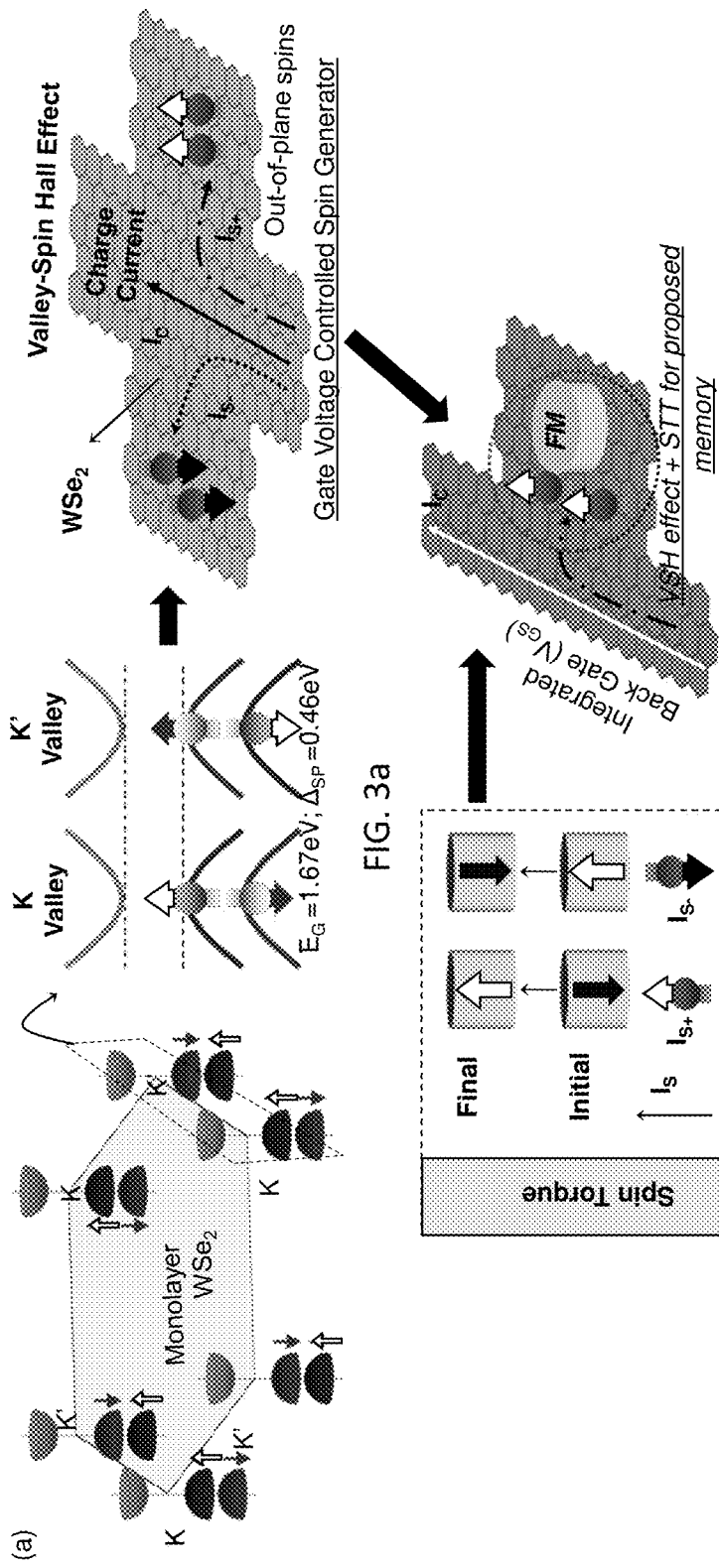
FIG. 3a is a schematic of a band structure of $WSe_2$ showcasing spin-valley coupling resulting in VSH effect, according to the present disclosure.
FIGS. 3b and 3c are schematics of spin-transfer-torque (STT) for switching perpendicular magnetic anisotropy (PMA) magnet and the novel idea of coupling VSH effect and spin torque for NVM design, respectively and according to the present disclosure), disclosing a valley-coupled spintronic devices with a small footprint without an access transistor for energy-efficient data storage.

Utilizing the unique attributes of VSH effect in conjunction with spin torque physics (as shown in FIGS. 3b and 3c which are schematics of STT for switching PMA magnet and the novel idea of coupling VSH effect and spin torque for NVM design, respectively and according to the present disclosure), a valley-coupled spintronic devices is disclosed with a small footprint for energy-efficient data storage.

Towards this end, the present disclosure provides an energy-efficient VSH effect based single-ended and differential spintronic memory devices and their access-transistor-less arrays (i.e., memory cells without access transistors). The single-ended and differential design are referred herein to as VSH- and DVSH-MRAMs, respectively. Detailed array and system-level analysis are also provided for the VSH-MRAMs and DVSH-MRAMs of the present disclosure in comparison with existing GSH-MRAMs and DGSH-MRAMs in the context of a general-purpose processor and an intermittently-powered system.

Figure 5A:
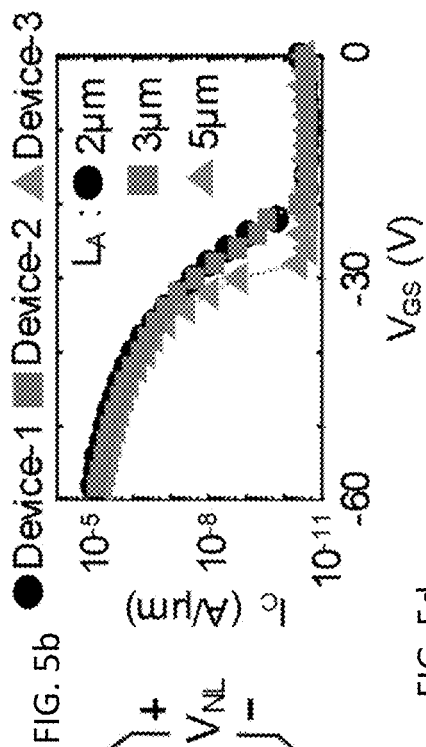
FIG. 5a is a schematic of a non-local measurement setup for measuring parameters of the devices of the present disclosure.
Figure 5B:
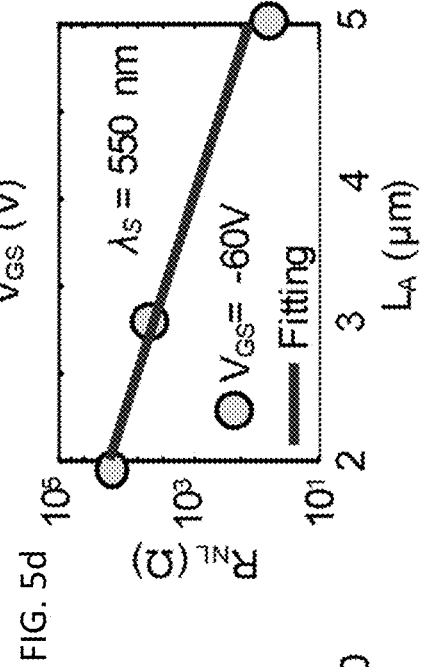
FIGS. 5b and 5c are graphs of gate control of charge current (k) and NL resistance ($R_{NL}=V_{NL}/I_C$) for different device samples with arm lengths ($L_A$).
Figure 5C:
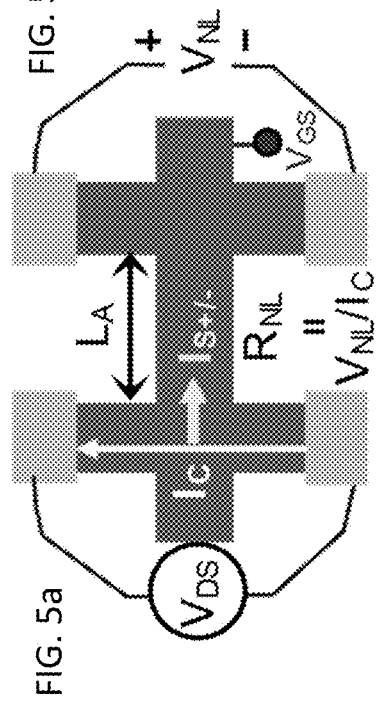
Figure 5D:
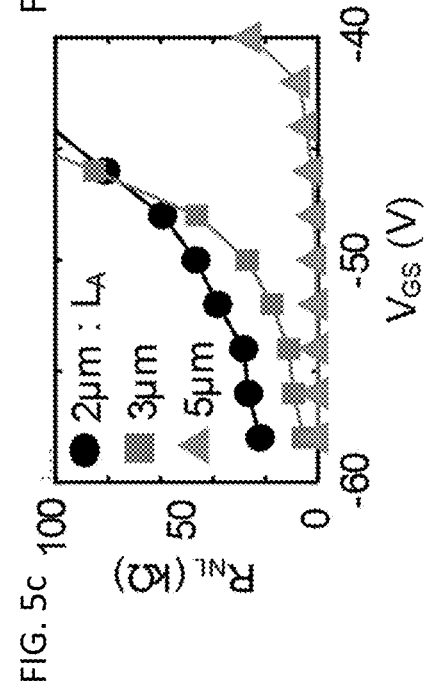
FIG. 5d is a graph of $R_{NL}$ ($R_{NL}=V_{NL}/I_C$) vs. arm length ($L_A$) of the memory device of the present disclosure.

Two types of measurements were performed, as illustrated in FIGS. 4a, 4b, and 5a-5d. A conventional four-probe measurement (FIG. 4a, is a schematic of a four-probe measurement scheme) was conducted to extract sheet resistance ($\rho$), contact resistance ($R_C$) and total resistance ($R_{TOT}$). Results from these measurement are provided in FIG. 4b which is a graph of resistance vs. $V_{GS}$ showing the three aforementioned types of resistance, i.e., $\rho$, $R_C$, and $R_{TOT}$ vs. $V_{GS}$. The non-local (NL) measurements were performed to probe the Hall voltage induced by any carrier distributions due to the VSH and its reciprocal effect (see FIG. 5a which is a schematic of a non-local measurement setup). Note that only the ON state of the WSe$_2$ device is considered for valley-coupled-spin transport in the discussions below, since access to holes in the valence band is necessary. Referring to FIGS. 5b and 5c, graphs of gate control of charge current ($I_C$) and NL resistance ($R_{NL}=V_{NL}/I_C$) for different device samples with arm lengths ($L_A$) equal to 2 μm, 3 μm and 5 μm are shown. $R_{NL}$ vs $L_A$ at $V_{GS}=-60$ V was used to extract the spin flip length, $\lambda_S=550$ nm from the fitting of $R_{NL} \propto e\,(-L_A/\lambda_S)$. The results are shown in FIG. 5d which is a graph of $R_{NL}$ ($R_{NL}=V_{NL}/I_C$) vs. arm length ($L_A$) of the memory device. It is appreciated that the spin-generator is a p-type device and therefore it requires negative gate-to-source voltages to turn it ON.

Figure 6B:
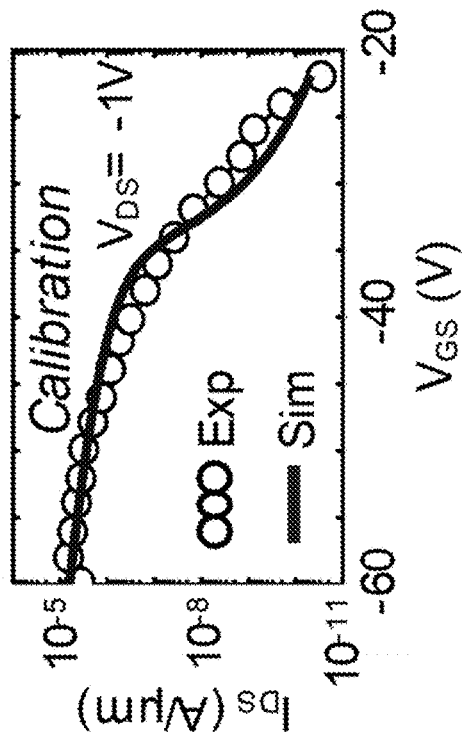
FIG. 6b is a calibration graph of $I_{GS}$ vs. $V_{GS}$ for experimental vs. simulation runs.
Figure 6A:
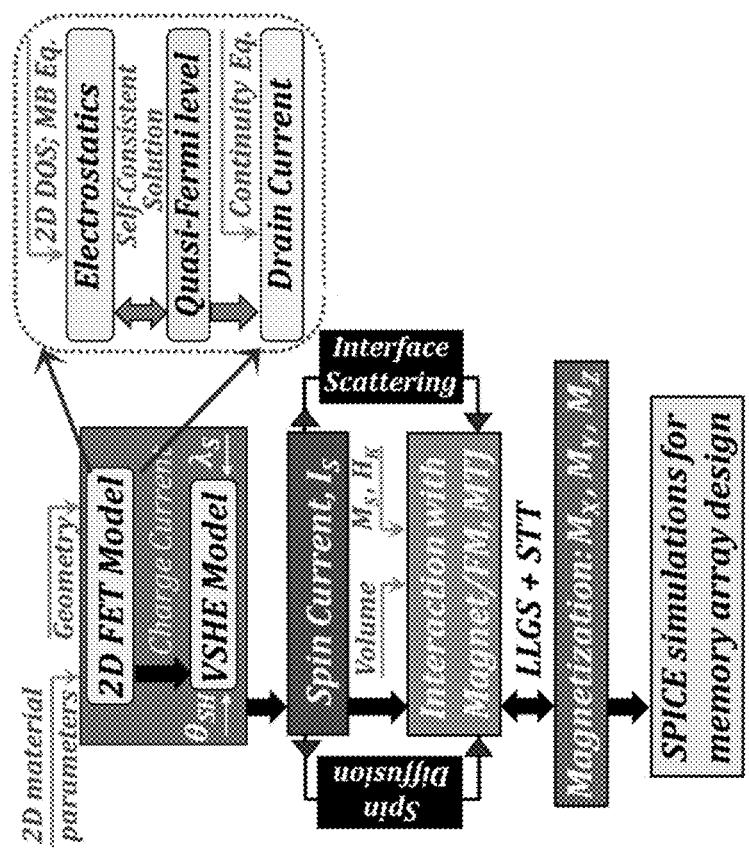
FIG. 6a is a flowchart for a self-consistent simulation framework for the memory device of the present disclosure.
Figures 6C, 6D:
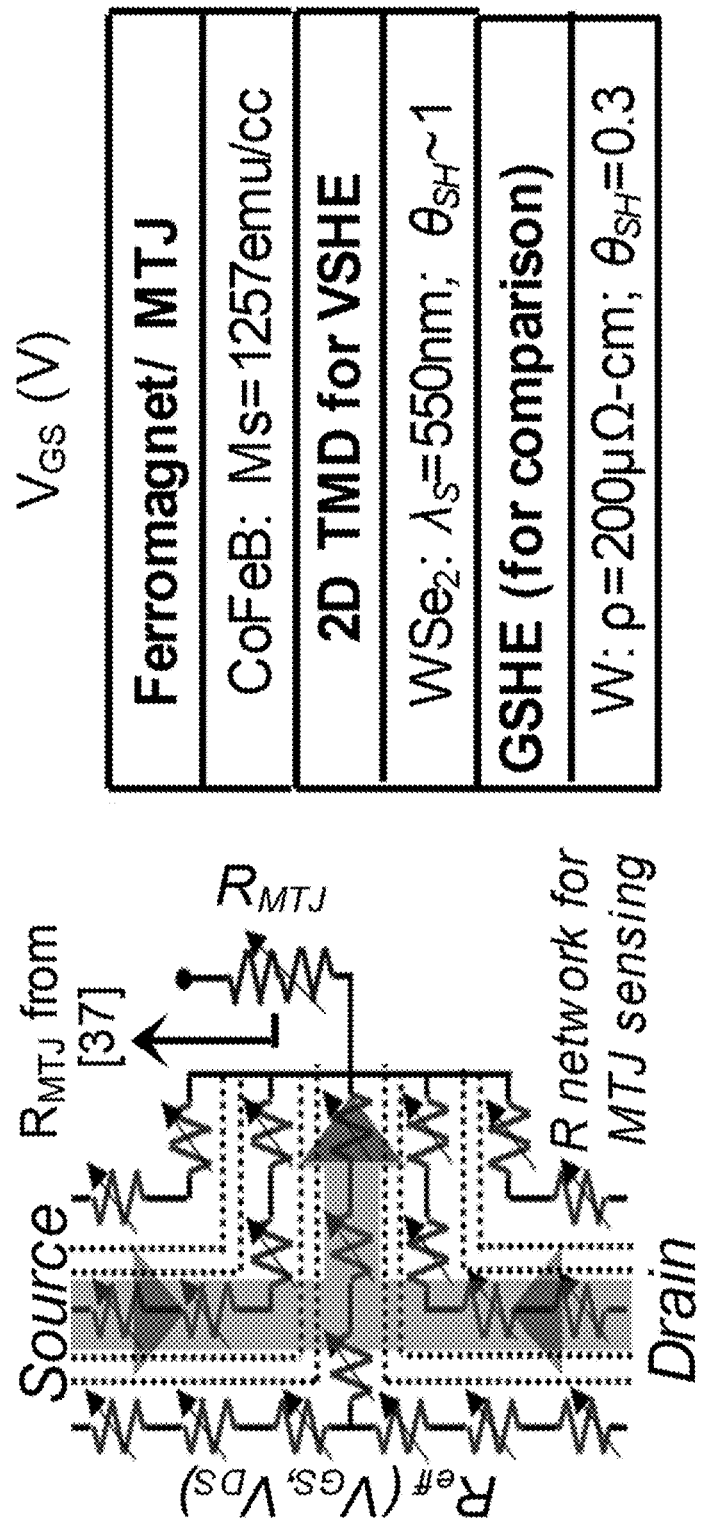
FIG. 6c is a schematic of a distributed resistance network for sensing MTJs based on the conductance of $WSe_2$ layer and the shape of the read path.
FIG. 6d is a list of the simulations parameters used in the present disclosure.

The memory device of the present disclosure was simulated using a self-consistent simulation framework in SPICE for the valley-coupled spintronic memory device/array of the present disclosure. Referring to FIG. 6a, a flowchart for a self-consistent simulation framework is shown for the memory device of the present disclosure. Monolayer WSe$_2$ electrostatics is modeled using the capacitance network model known in the art with modification for back-gated device used in the present disclosure. Further, the charge current is modeled using the continuity equations for drift-diffusion transport (see calibration in FIG. 6b which is a calibration graph of $I_{GS}$ vs. $V_{GS}$ for experimental vs. simulation runs). The charge current is then used in conjunction with the Valley Spin Hall effect model, which calculates the spin current based on the experimental $\theta_{SH}$ and $\lambda_S$ values. $I_S$ interacting with the free layer of MTJ is calculated as:

$$I_S = \frac{D_{MTJ}}{L_G} * \theta_{SH} * I_C \quad (2)$$

where $D_{MTJ}$ is the diameter of MTJ (circular) and $L_G$ is gate length of the transistor. Referring to FIG. 2a-2d two different embodiments (FIGS. 2a,2c and 2b,2d) of the memory cell according to the present disclosure are provided. Spin diffusion and interface scattering are considered in the monolayer WSe$_2$ channel while calculating the spin current flow as for the method disclosed herein. Landau-Lifshitz-Gilbert-Slonczewski (LLGS) equation is used to model the switching dynamics of the PMA magnet, which serves as the free layer (FL or Free Layer) of a magnetic tunnel junction (MTJ) formed on top of the TMD (as described later). For sensing, the MTJ resistance ($R_{MTJ}$) model is obtained from the prior art, known to a person having ordinary skill in the art. Further, as discussed below, the read path is 'T'/'H' shaped. To properly account for the sensed currents, a distributed resistive network is used (as shown in FIG. 6c which is a schematic of a distributed resistance network for sensing MTJs) based on the conductance of WSe$_2$ layer and the shape of the read path. Therefore, the read path includes the resistance of the MTJ as well as that of conducting WSe$_2$ layer. The sensed currents are used to read the bit-information stored and also perform computation in memory. Contact resistances at the drain terminal is included, source terminal and MTJ-TMD interface based on (accounting for Schottky barrier). Referring to FIG. 6d, the simulations parameters used in the present disclosure are listed. A minimum gate length ($L_G$) of 45 nm is used in the simulations.

The process flow for the fabrication of the device of the present disclosure is now disclosed. Chemical vapor deposition (CVD) grown WSe$_2$ films were transferred to 90 nm SiO$_2$ substrates with highly doped silicon on the back side. Doped Si serves as the integrated back gate for controlling the flow of IC and IS (as explained later). Standard e-beam lithography using PMMA A4 950 resist was employed to pattern electric contacts on the CVD WSe$_2$ flakes. Ti/Pd (0.5/50 nm) was deposited in an e-beam evaporator followed by a lift-off process in acetone. CVD grown BN film was transferred from Cu foil onto the devices through a process that involves etching the Cu foil with iron chloride (FeCl$_3$) and immersing it in diluted HCl and DI water alternatingly for few times before scooping up. This BN layer was inserted to minimize device degradation from PMMA residues after the RIE etching process, but not necessary for general (D)VSH-MRAM fabrication. RIE etching mask was defined by e-beam lithography using PMMA A4 950 resist and BN/WSe$_2$ flakes were etched using Ar/SF6 for 10 seconds. The final devices underwent nitric oxide (NO) furnace annealing at 150° C. for two hours followed by vacuum annealing (~10-8 torr) at 250° C. for four hours to minimize PMMA residue and threshold voltage shift due to trap charges.

Figures 7A, 7B, 7C:
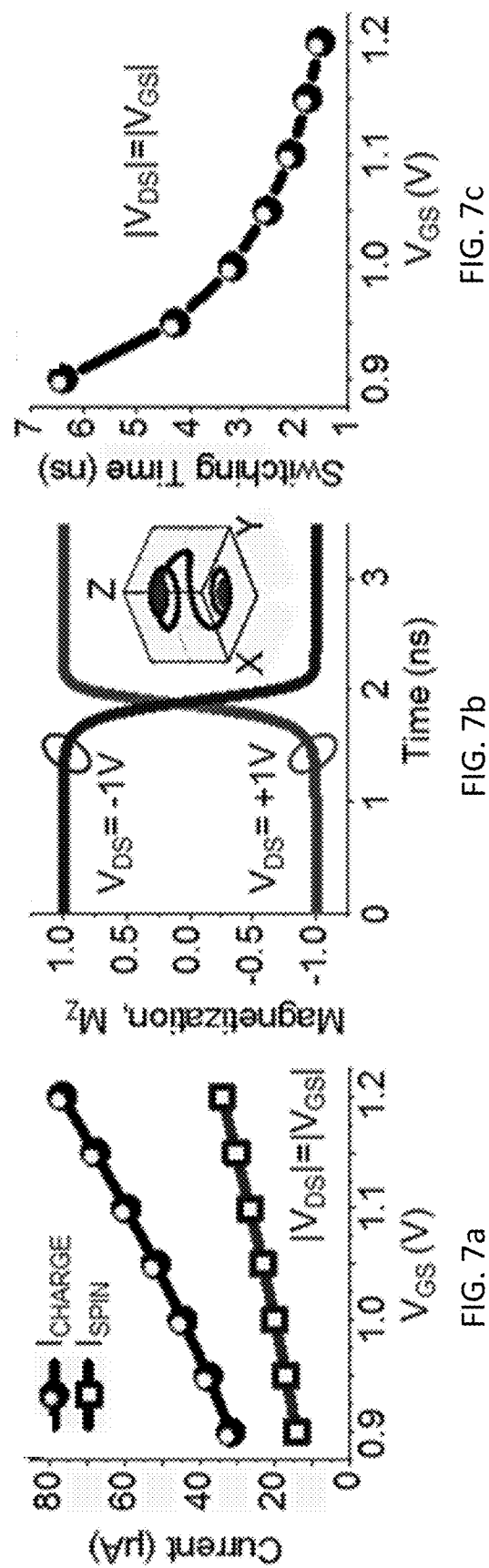
FIG. 7a are graphs of simulated gate voltage ($V_{GS}$) vs. modulated charge and spin current flow.
FIG. 7b is a graph of magnetization vs. time for $V_{DS}$=1 V and $V_{DS}$=−1 V.
FIG. 7c is a graph of switching time vs. $V_{GS}$.

As discussed above, charge current flowing through the monolayer WSe$_2$ generates transverse spin currents. Referring to FIG. 7a, a graph of simulated gate voltage ($V_{GS}$) vs. modulated charge and spin current flow are shown. The polarity of $V_{DS}$ determines the polarization for the spin current flowing towards the MTJ resulting in corresponding magnetization switching as illustrated in FIG. 7b which is a graph of magnetization vs. time for $V_{DS}=1$ V and $V_{DS}=-1$ V. Since, the gate voltage controls the carrier density in the WSe$_2$ layer, the magnetization switching time is gate controllable as shown in FIG. 7c which is a graph of switching time vs. $V_{GS}$. Higher $|V_{GS}|$ corresponds to larger $I_C$ (or $I_S$) which in turn results in smaller magnetization switching time. For the VSH-MRAM or DVSH-MRAM cells according to the present disclosure, switching time ranging from 3.2 ns to 1.5 ns for $V_{GS}=-1.0$ V to $-1.2$ V are achieved. Note, the magnetization switching time for VSH and DVSH-MRAMs devices remain similar because of the inherent and concurrent generation of the complementary spin currents ($I_{S+}$ and $I_S$) due to the VSH effect. In comparison, prior art GSH-MRAM cells (see, e.g., FIG. 1b) exhibit a switching time ranging from 11.6 ns to 4.0 ns for $V_{DD}=1.0$ V to 1.2 V. The benefits are attributed to the easier switching of PMA magnets in VSH-MRAMs when compared to IMA in GSH- MRAMs, mainly due to lower switching current requirement for a given thermal stability.

It should be noted that when $V_{GS}$=0 V, the VSH memory device is OFF and the magnetization state is retained due to the non-volatility of the ferromagnet. To read or change the magnetization state stored, the device has to be turned ON (negative $V_{GS}$, since the inherent transistor is equivalent to a P-Channel device). As discussed further below, during read, even though the device is ON, no charge current flows from the drain to source (to avoid generation of spin current due to VSH effect), thereby safeguarding the magnetization state from any VSH-induced disturbance.

Figure 8B:
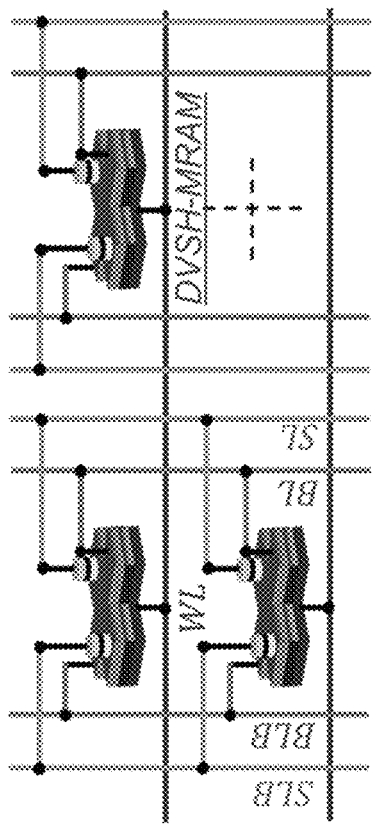
FIG. 8b is a schematic of a memory array architecture for DVSH-MRAM.
Figure 8A:
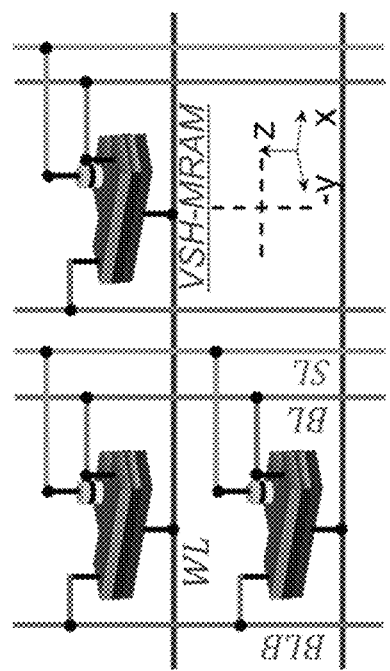
FIG. 8a is a schematic of a memory array architecture for VSH-MRAM.

In order to use the memory cells of the present disclosure in a memory array reference is now made to FIGS. 8a-8b. FIG. 8a is a schematic of a memory array architecture for VSH-MRAM while FIG. 8b is a schematic of a memory array architecture for DVSH-MRAM. In both cases, these arrays feature access-transistor-less cells by virtue of the integrated gate of the memory devices of the present disclosure. The integrated gates of all the memory cells in the same row are connected to the word-line (WL). The source, drain and the read-ports of all the cells in the same column are connected to bit-line (BL), bit-line-bar (BLB) and sense-line/sense-line-bar (SL/SLB) respectively. The integrated back gate provides selective word access in the array as discussed later. Read, write, and hold operations are described in reference to Table 1. Each of these modes are discussed below.

TABLE 1

Operation bias conditions for (D)VSH-MRAMs

Underlined:
| Precharged | WL | BL | BLB | SL | SLB |
|---|---|---|---|---|---|
| WRITE | 0 | $V_{DD}$/0 | 0/$V_{DD}$ | $V_{DD}$ | $V_{DD}$ |
| READ | 0 | $V_{DD}$ | $V_{DD}$ | $V_{DD}$-$V_{READ}$ | $V_{DD}$-$V_{READ}$ |
| HOLD | $\underline{V_{DD}}$ | $\underline{V_{DD}}$ | $\underline{V_{DD}}$ | $\underline{V_{DD}}$ | $\underline{V_{DD}}$ |

(i) Write: For writing into the memory cell of the present disclosure, 0 V is applied to WL of the accessed word (it should be noted again that the memory devices are p-type). BLs and BLBs are then asserted according to the bit-information which is to be stored (as discussed above, direction of charge current determines the bit stored). SLs and SLBs are kept pre-charged (and floating) at $V_{DD}$ (1.0 V). This creates a high impendence path for the charge current to flow through MTJ, avoiding accidental magnetization switching due to STT effect. Now, suppose bit-'0' is written. 0V/$V_{DD}$ is applied to BL/BLB in both VSH- and DVSH-MRAMs (e.g., $V_{DD}$=1.1 V). VSH effect as discussed above, flips the Free Layer of MTJ in VSH-MRAM to positive magnetization state (Mz=+1) and the MTJ comes to the Parallel (P) configuration. While for DVSH-MRAM, Free Layers of $MTJ_R$ and $MTJ_L$ flip to positive and negative magnetization states ($M_Z$=+1 and −1) which brings them to P and anti-parallel (AP) configurations respectively, corresponding to bit-'0'. On the other hand, for writing bit-'1', $V_{DD}$/0V is applied to BL and BLB, and the VSH effect leads to storage of $M_Z$=−1 in FL of MTJ (AP) of VSH-MRAM and $M_Z$=−1/+1 in FL of $MTJ_R$(AP)/$MTJ_L$(P) of DVSH-MRAM. Note, in DVSH-MRAM, the true bit value is stored in $MTJ_R$ while the complementary bit is stored in $MTJ_L$. After write, all lines are pre-charged to $V_{DD}$. Note, the BLs/BLBs, SLs/SLBs of the unaccessed cells are precharged to $V_{DD}$, while the WLs are driven to $V_{DD}$ to avoid any unintentional $M_Z$ switching. This corresponds to $V_{GS}$=$V_{DS}$=0V in the unaccessed memory devices resulting in insignificant charge/spin current flow (no write disturbance).

(ii) Read: For reading the bit-information, 0V is applied to WL and $V_{DD}$ to BLs and BLBs of the accessed word. The SLs and SLBs are driven to $V_{DD}$-$V_{READ}$. This brings the memory devices of the accessed word to the ON state and there exists a read current flow between the sense line(s) and source/drain terminals of the memory cell (due to the voltage difference, $V_{READ}$=0.4 V). The read current ($I_{SL}$/$I_{SLB}$) depends on the resistance of the MTJ storing P or AP configuration (as discussed above). For VSH-MRAM, $I_P$ is the current sensed at SL when the memory cell stores bit-'0' (parallel configuration of MTJ) and $I_{AP}$ is the current sensed when bit-'1' is stored (anti-parallel MTJ), where $I_P$>$I_{AP}$. For DVSH-MRAM, $I_P$ ($I_{AP}$) and $I_{AP}$ ($I_P$) are the currents sensed at SL and SLB when the bit stored is '0' ('1'). VSH-MRAMs employs single-ended sensing, where a reference cell current, $I_{REF}$=($I_P$+$I_{AP}$)/2 is used to compare the current flowing through SL ($I_{SL}$). On the other hand, DVSH-MRAM is self-referenced. After the read operation, all lines are pre-charged to $V_{DD}$. Note, similar to the write operation, the BLs/BLBs and SLs/SLBs of the unaccessed cells are pre-charged to $V_{DD}$ and the WLs are driven to $V_{DD}$ to avoid any disturbances.

(iii) Hold/Sleep: During the hold operation, all the lines of the memory array are precharged to $V_{DD}$. This process also ensures minimal energy consumption during charging/discharging of bit-lines for memory's read/write operations. On the other hand, during the sleep mode, i.e., when the power supply is completely shut down for a long time, all lines (BL/BLB, SL/SLB and WL) are driven to 0V. In both these cases (hold and sleep modes), the non-volatility of the magnetization in FL of MTJ ensures storage of the bit-information even in the absence of any external power supply leading to zero stand-by leakage power.

Figure 9:
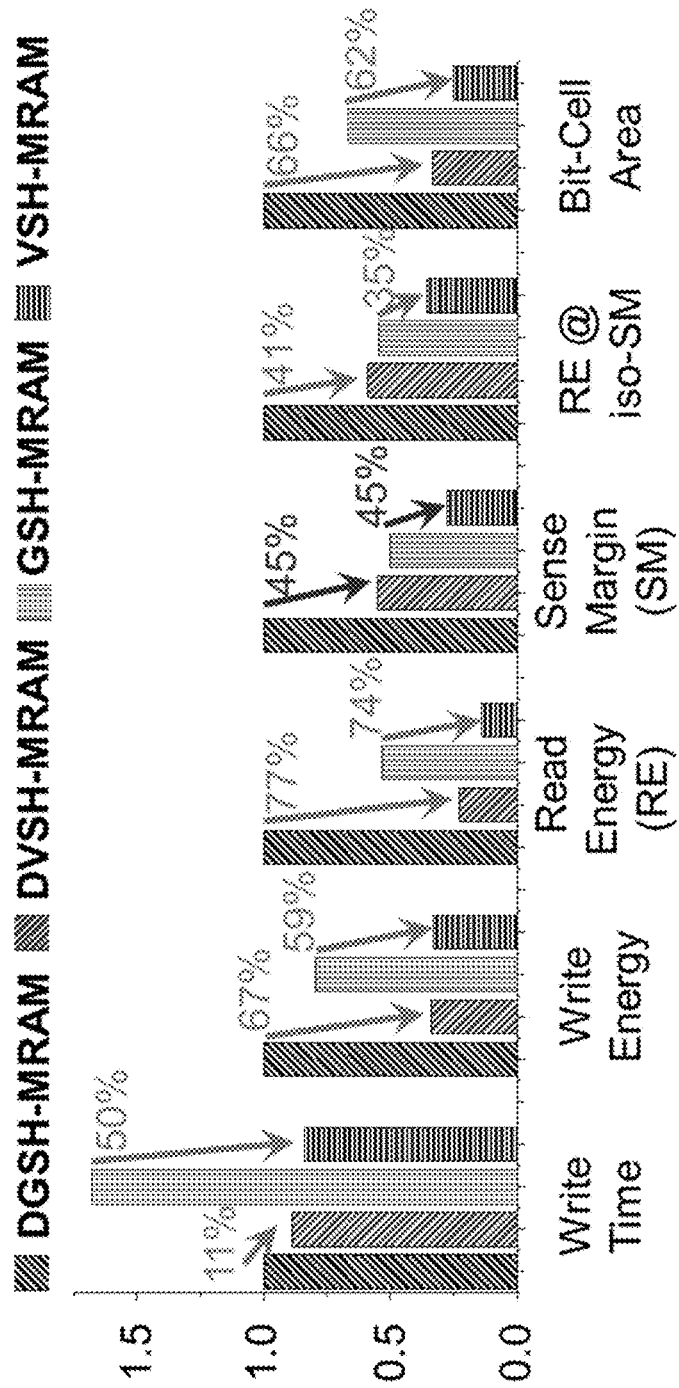
FIG. 9 is a bar graph which illustrates the array level comparison of the memory designs of the present disclosure.

To evaluate the performance of the memory devices of the present disclosure, a comparison of these memory cells is made with existing GSH/DGSH-MRAMs for a 1 MB array (8 banks, each bank with 1024 rows and 1024 columns) with 32-bit words and evaluate the area, write and read metrics. Iso-energy barrier of about 55 $K_B$T (>10 years of retention) for PMA MTJs in the VSH/DVSH-MRAMs of the present disclosure and IMA MTJs in GSH/DGSH-MRAMs is considered for a fair evaluation. This is achieved by tuning the device geometry. Referring to FIG. 9 a bar graph is shown which illustrates the array level comparison of these memory designs.

First, the VSH/DVSH-MRAMs of the present disclosure achieve 66/62% lower bit-cell area compared to GSH/DGSH-MRAMs. This is attributed to the access transistor less array design achieved due to the unique integrated back gate feature. The lower bit-cell area leads to reduced metal-line capacitances (for word-lines/bit-lines) in the memory array. This feature, along with other properties of the VSH effect, enhances the energy efficiencies for memory operations for VSH/DVSH-MRAM.

The write metrics of the proposed VSH and DVSH-MRAMs remain similar because of the inherent and concurrent generation of $I_{S+}$ and $I_{S-}$ due to the VSH effect (as discussed above). However, the same property does not hold true for the GSH and DGSH-MRAMs because of different number of access transistors (one and two respectively) driving the write operation. The analysis shows that VSH/DVSH-MRAMs achieve 59%/67% lower write energy (WE) and 50%/11% lower write time (WT) compared to the GSH/DGSH-MRAM. This is attributed to two factors. First, the unique generation of out-of-plane spin currents with VSH-effect enables the switching of PMA magnets, unlike GSH effect which can only switch IMA magnets. It is understood that IMA switching is relatively less energy-efficient than PMA switching due to demagnetization fields. Second, lower cell area in the proposed memories results in reduced time and energy consumption for bit-line charging/dis-charging during the write operation.

The PMA MTJs in VSH/DVSH-MRAMs exhibit higher resistance due to its smaller area compared to IMA MTJs in GSH/DGSH-MRAMs at iso-energy barrier. Moreover, the $WSe_2$ FET is more resistive than a silicon-based FET used in (D)GSH-MRAMs due to lower mobility. This results in lower sensing currents in VSH/DVSH-MRAMs during the read operation. At the same time, lower area of the proposed memory array due to the integrated back gate feature reduces the bit-line charging/dis-charging energy. Both these factors lead to 74%-77% lower read energy consumption in the proposed memories. However, the lower sensed currents result in 45% lower sense margin for VSH/DVSH-MRAMs compared to GSH/DGSH-MRAMs, at $V_{READ}$=0.4 V. At iso-sense margin (achieved by reducing $V_{READ}$ for (D)GSH-MRAM to 0.15 V), 35%/41% lower read energy is achieved by VSH/DVSH-MRAMs.

With respect to the single-ended VSH-MRAMs, differential DVSH-MRAMs exhibit 50% improved sense margin with a penalty of 64% increase in read energy, attributed to the additional sense-line (SLB) charging energy. However, at iso-sense margin, achieved by reducing $V_{READ}$ of DVSH-MRAM to 0.2 V, similar read energies are observed for VSH and DVSH-MRAMs. To evaluate the system-level benefits of the VSH-MRAM and DVSH-MRAM designs of the present disclosure, performance is measured when used as an L2 cache (unified memory) in a general-purpose processor.

Figure 10:
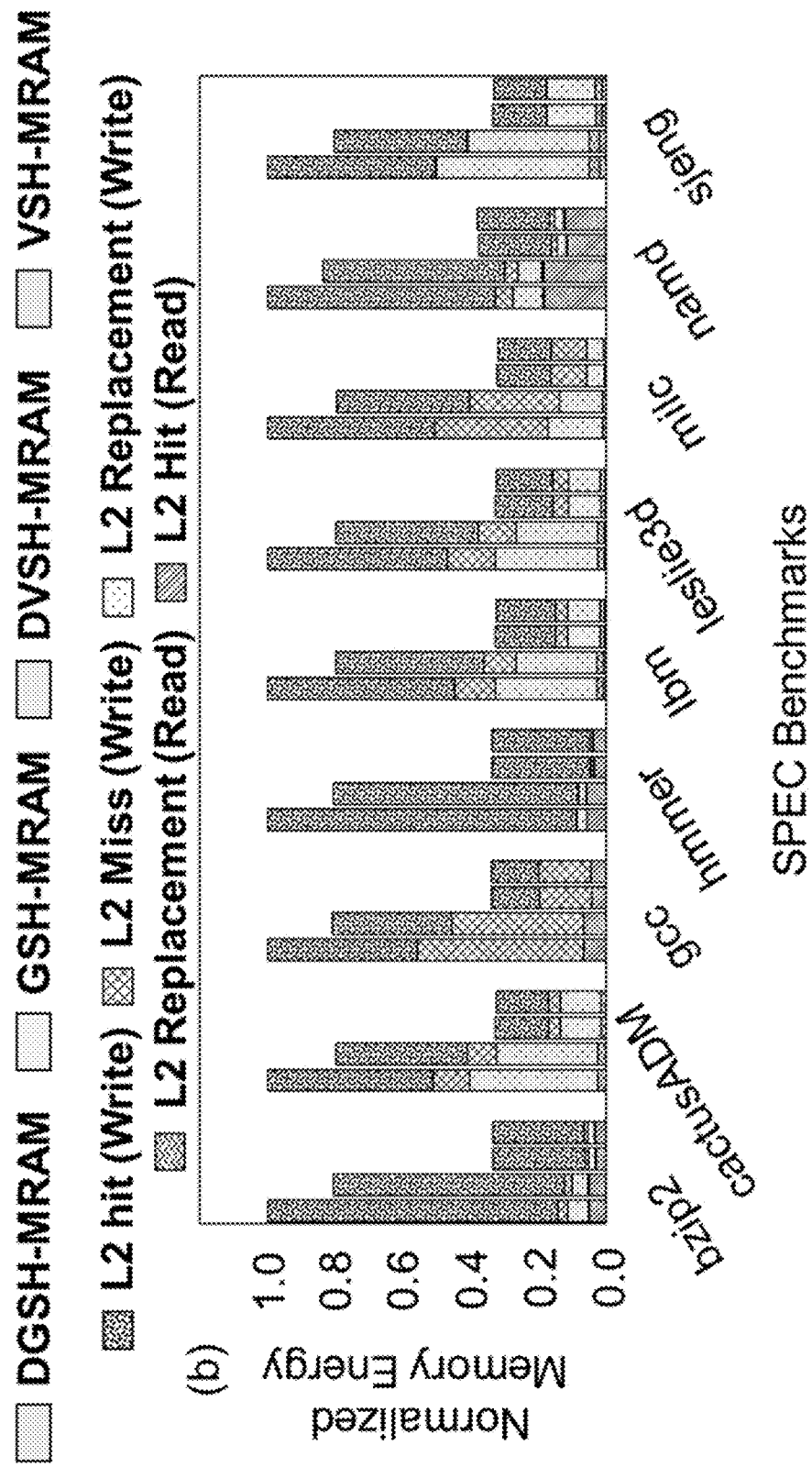
FIG. 10 is a bar graph of normalized memory energy for various SPEC benchmarks for DGSH, GSH, DVSH and VSH-MRAMs.

Referring to FIG. 10, a bar graph of normalized memory energy for various SPEC benchmarks for DGSH, GSH, DVSH and VSH-MRAMs is provided. It also shows the energy consumed by the major L2 cache operations, which are, reads during L2-hits, reads and writes during L2-replacements, and writes during L2-misses and L2-hits. Across a suite of SPEC2K6 benchmarks, VSH-MRAM and DVSH-MRAM exhibit similar L2 cache energy due to similar write and read energies (at iso-sense margin) as discussed above. In comparison with DGSH-MRAM and GSH-MRAM, the proposed VSH-MRAMs and DVSH-MRAMs show 2.63-3.14× and 2.19-2.50× reduction in the total L2 cache energy, respectively. Further, the applications (e.g., milc) with a lower read/write ratio show higher benefits. This is because the memory cell designs of the present disclosure can perform writes far more efficiently compared to the baseline designs.

Figure 11:
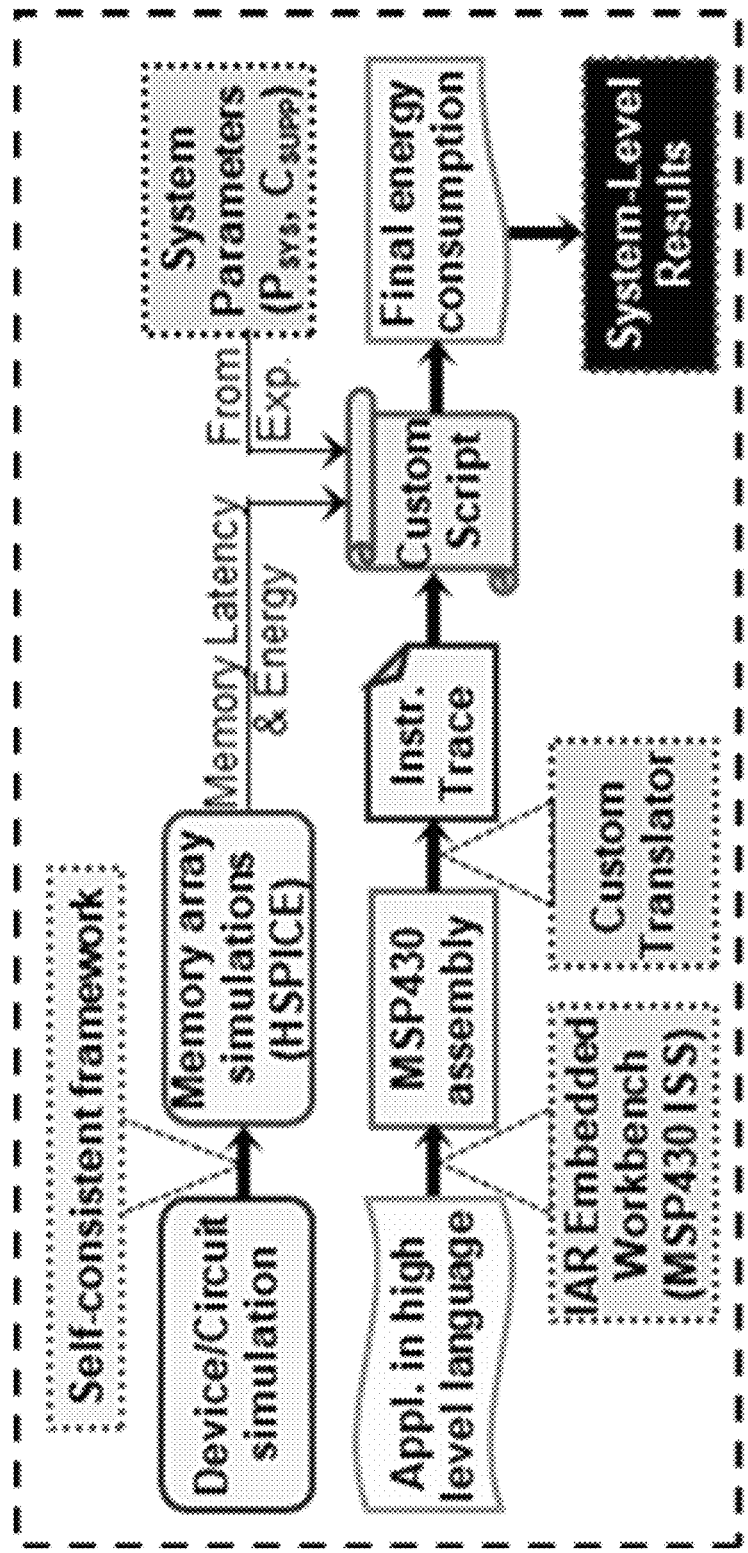
FIG. 11 is a schematic of a simulation framework, according to the present disclosure.
Figure 12A:
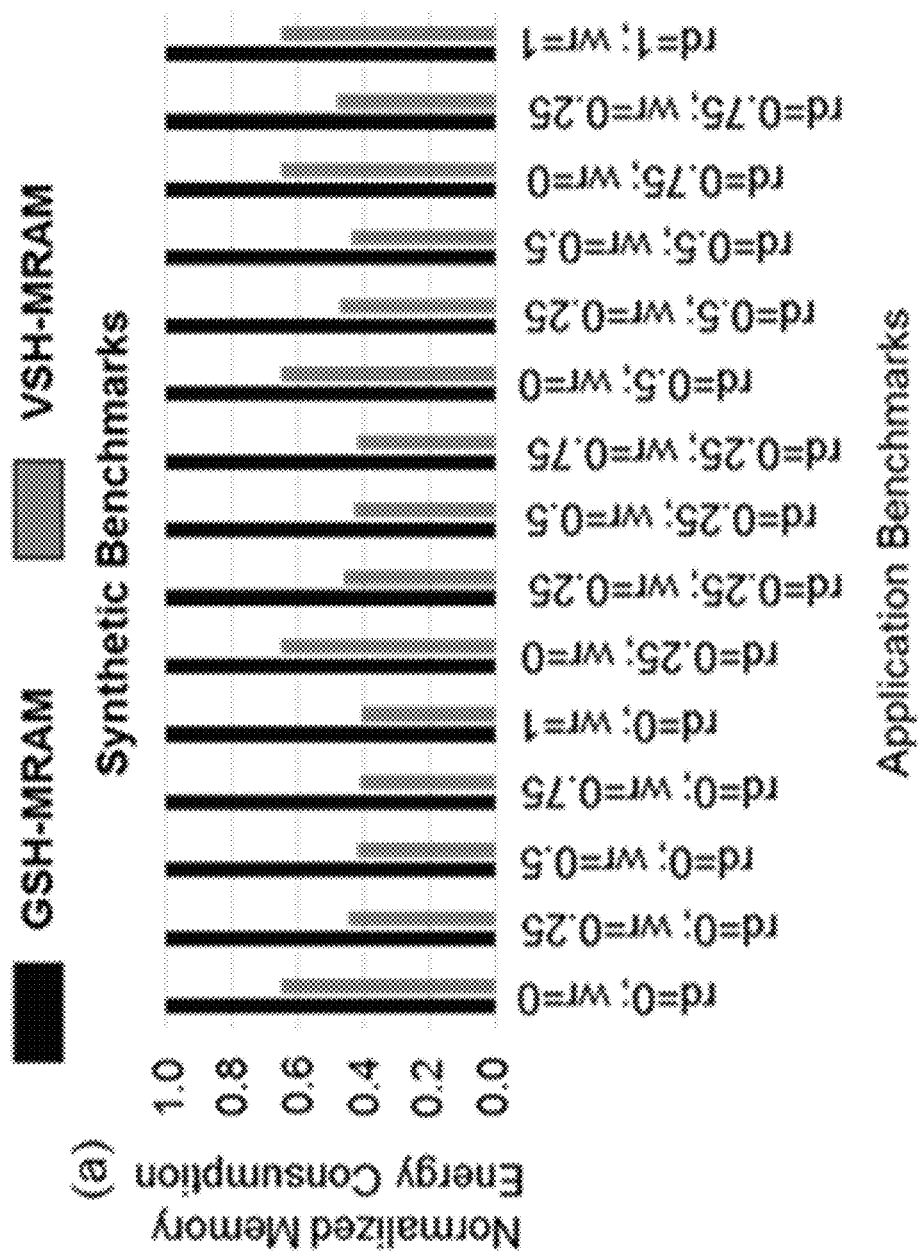
FIGS. 12a and 12b are bar graphs representing normalized system energy consumption of VSH and GSH-MRAM for (a) synthetic and (b) real application benchmarks, respectively.
Figure 12B:
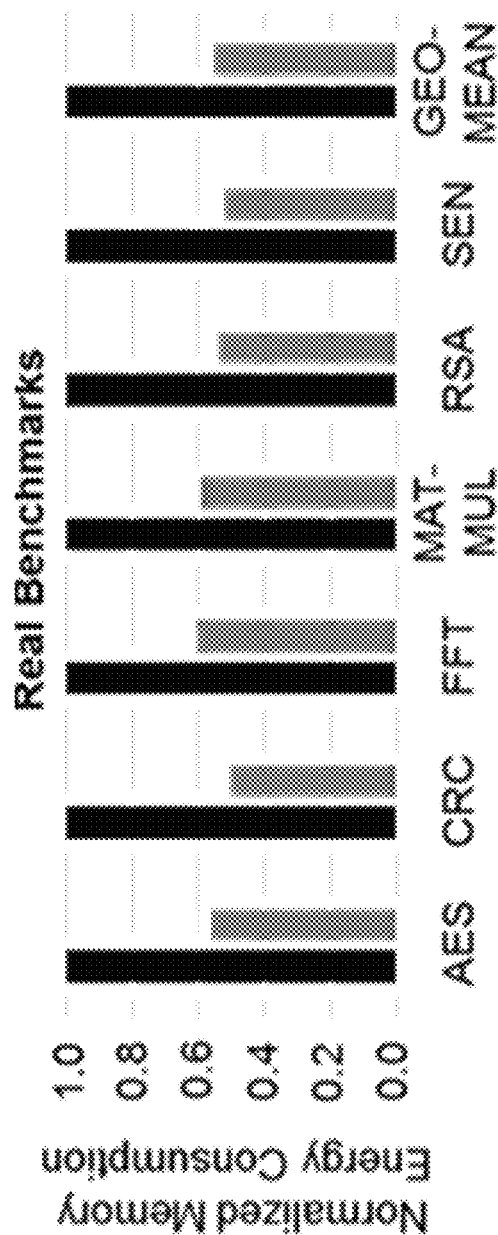

Due to the tight energy constraints of intermittently powered systems, the more energy-efficient design for GSH memory is chosen for this analysis (single ended GSH-MRAM consumes less energy than the differential design—see FIG. 9). Also, for fair comparison, the analysis covers only VSH-MRAM (although both VSH and DVSH MRAMs show similar energy efficiency at iso-sense margin as discussed before). Referring to FIG. 11, a schematic of a simulation framework is shown which is used, according to the present disclosure. The system-level simulations are based on the TI MSP430FR5739 microcontroller-based edge platform running at 24 MHz and use a unified 32 kB NVM based on the proposed VSH-MRAM (with iso-sense margin of 1.85 μA compared to the baseline GSH-MRAM). The system is powered using an energy harvesting source that charges a supply capacitor of 10 nF. The system configuration and set of real benchmarks used are shown in Tables 2 and 3. Results are showcased in FIGS. 12a and 12b which are bar graphs representing normalized system energy consumption of VSH and GSH-MRAM for (a) synthetic and (b) real application benchmarks, respectively, which depict total memory energy consumption for iso-work conditions. Note, the energy numbers in FIGS. 12a and 12b are normalized to GSH-MRAM energy consumption.

TABLE 2 system configurations for the simulation framework

| Feature | Description |
| --- | --- |
| Microcontroller Architecture | 16-bit RISC-based TI MSP430FR5739 |
| Total #Config Registers | 165 |
| Memory Architecture (Capacity) | Unified NVM (32 KB) |
| Proc. Pipeline Stages | Single Cycle (No Pipeline) |
| Frequency of operation | 24 MHz |
| Supply Capacitance | 10 nF |

TABLE 3

Application benchmark used for evaluation

| Benchmark | Description (C) |
| --- | --- |
| AEC | Perform Advanced Encryption Standard-based encryption on 256 messages |
| CRC | Compute 16-bit Cyclic Redundancy Code for error-correction of 256 messages |
| FFT | Execute Fast Fourier Transform on sample data. |
| MAT-MUL | Compute Matrix Multiplication among two matrices. |
| RSA | Run Rivest-Shamir-Adleman cryptography Description |
| SENSE | Sample 100 Sensor readings and perform various statistical computation |

The energy savings obtained from using VSH-MRAMs compared to GSH-MRAMs depend primarily on the program characteristics, i.e., total number of reads and writes during program execution while executing a specific application. A set of synthetic benchmarks were constructed where the fraction of total memory read and write instructions are varied with a constant checkpoint size of 128B and total number of instructions (100K). Here, the expression {rd:0.25, wr:0.25} represents that 25% of the total instructions are memory reads, 25% are memory writes, and the rest are normal computational operations. With reference back to FIG. 12a, it can be observed that the VSH-MRAMs of the present disclosure achieve significant energy benefits over GSH-MRAMs, ranging from 35% to 59% for a wide spectrum of synthetic memory instructions. This is attributed to the improved read-write energy (at iso-sense margins). For real application benchmarks, VHS-MRAMs exhibit energy savings in the range of 40%-49% (1.66×-1.98×) and 45% (1.80×) on an average compared to GSH-MRAMs (see FIG. 12b).

Those having ordinary skill in the art will recognize that numerous modifications can be made to the specific implementations described above. The implementations should not be limited to the particular limitations described. Other implementations may be possible.

The invention claimed is:

1. A memory cell, comprising:
a semiconductor layer;
a first electrode coupled to the semiconductor layer;
a second electrode coupled to the semiconductor layer, wherein the first and second electrodes are separated from one another along a first axis and wherein the semiconductor layer extends beyond the first axis along a second axis substantially perpendicular to the first axis, thereby forming a first wing;

a third electrode separated from the semiconductor layer by an insulating layer;
a first magnetic tunnel junction (MTJ) disposed on the first wing; and
a first read electrode coupled to the first MTJ.

2. The memory cell of claim 1, wherein placing an on-state voltage on the third electrode causes the semiconductor layer to switch on allowing conduction of electrical current between the first and the second electrodes establishing a charge current which generates a first spin current perpendicular to the charge current, which in turn generates a first magnetic spin which then generates spin orbit torque resulting in flipping of the first MTJ thereby causing a write operation to the first MTJ.

3. The memory cell of claim 2, wherein the on-state voltage represents a voltage drop above a voltage threshold across the first and third electrodes.

4. The memory cell of claim 3, wherein i) placing the on-state voltage on the third electrode causes the semiconductor layer to switch on, and ii) placing a first read voltage across the first electrode and the first read electrode and placing substantially the first read voltage across the second electrode and the first read electrode thereby generating a first read current, wherein the first read current represents a value corresponding to state of the first MTJ, thereby performing a read operation from the first MTJ, wherein an off-state voltage represents a voltage drop below the voltage threshold across the first and third electrodes.

5. The memory cell of claim 1, wherein the semiconductor layer includes $WSe_2$, $MoS_2$, $MoSe_2$, $WS_2$, or a combination thereof.

6. The memory cell of claim 5, wherein the semiconductor layer further extends beyond the first and second electrodes forming a second wing, opposite the first wing along the second axis.

7. The memory cell of claim 6, further comprising:
a second MTJ disposed on the second wing, the second MTJ having a structure essentially identical to the first MTJ; and
a second read electrode coupled to the second MTJ.

8. The memory cell of claim 7, wherein placement of an on-state voltage on the third electrode further generates a second spin current opposite the first spin current perpendicular to the charge current, which in turn generates a second magnetic spin opposite the first magnetic spin which then generates spin orbit torque resulting in flipping of the second MTJ opposite the first MTJ thereby causing a write operation to the second MTJ.

9. The memory cell of claim 8, wherein i) placing the on-state voltage on the third electrode, and ii) placing a second read voltage across the first electrode and the second read electrode and placing substantially the second read voltage across the second electrode and the second read electrode thereby generating a second read current, wherein the second read current represents a value corresponding to the state of the first MTJ, thereby performing a read operation from the second MTJ, wherein an off-state voltage represents a voltage drop below the voltage threshold across the first and third electrodes.

10. An array of memory cells, comprising:
a plurality of memory cells dispersed in one or more rows and one or more columns, each comprising:
a first electrode coupled to the semiconductor layer,
a second electrode coupled to the semiconductor layer, wherein the first and second electrodes are separated from one another along a first axis and wherein the semiconductor layer extends beyond the first axis along a second axis substantially perpendicular to the first axis, thereby forming a first wing,
a third electrode separated from the semiconductor layer by an insulating layer;
a first magnetic tunnel junction (MTJ) disposed on the first wing, and
a first read electrode coupled to the first MTJ;
a wordline (WL) for each row of the one or more rows coupled to the third electrodes of each of the associated memory cells in the associated row;
a bit line (BL) for each column of the one or more columns coupled to the first electrodes of each of the associated memory cells in the associated column;
a bit line bar (BLB) for each column of the one or more columns coupled to the second electrodes of each of the associated memory cells in the associated column; and
a select line (SL) for each column of the one or more columns coupled to the first read electrodes of each of the associated memory cells in the associated column,
wherein by selectively activating the WL, BL, BLB, and SL, each of the memory cells is accessed for writing or reading i) one memory cell at a time, ii) a row of memory cells at a time, iii) column of memory cells at a time, or iv) the array at a time.

11. The array of memory cells of claim 10, wherein placing an on-state voltage on the WL causes the semiconductor layer of the associated memory cell to switch on allowing conduction of electrical current between the first and the second electrodes establishing a charge current which generates a first spin current perpendicular to the charge current, which in turn generates a first magnetic spin which then generates spin orbit torque resulting in flipping of the first MTJ thereby causing a write operation to the first MTJ of the associated memory cell.

12. The array of memory cells of claim 11, wherein the on-state voltage represents a voltage drop above a voltage threshold across the first and third electrodes of the associated memory cell.

13. The array of memory cells of claim 12, wherein i) placing the on-state voltage on the third electrode causes the semiconductor layer to switch on, and ii) placing a first read voltage across the first electrode and the first read electrode and placing substantially the first read voltage across the second electrode and the first read electrode thereby generating a first read current, wherein the first read current represents a value corresponding to state of the first MTJ, thereby performing a read operation from the first MTJ of the associated memory cell.

14. The array of memory cells of claim 13, wherein an off-state voltage represents a voltage drop below the voltage threshold across the first and third electrodes of the associated memory cell.

15. The array of memory cells of claim 10, wherein the semiconductor layer includes $WSe_2$, $MoS_2$, $MoSe_2$, $WS_2$, or a combination thereof.

16. The array of memory cells of claim 15, wherein the semiconductor layer of the associated memory cell further extends beyond the first and second electrodes forming a second wing, opposite the first wing along the second axis.

17. The array of memory cells of claim 16, further comprising:
a second MTJ disposed on the second wing, the second MTJ having a structure essentially identical to the first MTJ; and
a second read electrode coupled to the second MTJ.

18. The array of memory cells of claim 17, wherein placement of an on-state voltage on the third electrode of the associated memory cell further generates a second spin current opposite the first spin current perpendicular to the charge current, which in turn generates a second magnetic spin opposite the first magnetic spin which then generates spin orbit torque resulting in flipping of the second MTJ opposite the the first MTJ thereby causing a write operation to the second MTJ.

19. The array of memory cells of claim 18, wherein i) placing the on-state voltage on the third electrode, and ii) placing a second read voltage across the first electrode and the second read electrode and placing substantially the second read voltage across the second electrode and the second read electrode thereby generating a second read current, wherein the second read current represents a value corresponding to the state of the first MTJ, thereby performing a read operation from the second MTJ, wherein an off-state voltage represents a voltage drop below the voltage threshold across the first and third electrodes of the associated memory cell.

* * * * *

UNITED STATES PATENT AND TRADEMARK OFFICE
CERTIFICATE OF CORRECTION

PATENT NO. : 11,688,445 B2
APPLICATION NO. : 17/588317
DATED : June 27, 2023
INVENTOR(S) : Sandeep Krishna Thirumala et al.

It is certified that error appears in the above-identified patent and that said Letters Patent is hereby corrected as shown below:

In the Specification

On Column 1, Line 20, under section titled "STATEMENT REGARDING GOVERNMENT FUNDING" and before section titled "TECHNICAL FIELD", please replace "None." with "This invention was made with government support under 70NANB17H041 awarded by the National Institute of Standards and Technology. The government has certain rights in the invention."

Signed and Sealed this
Twenty-first Day of November, 2023

Katherine Kelly Vidal
*Director of the United States Patent and Trademark Office*